United States Patent

Peschke et al.

[11] Patent Number: 5,960,318
[45] Date of Patent: Sep. 28, 1999

[54] BORDERLESS CONTACT ETCH PROCESS WITH SIDEWALL SPACER AND SELECTIVE ISOTROPIC ETCH PROCESS

[75] Inventors: Matthias L. Peschke, Ottendorf-Okrilla, Germany; Jeffrey Gambino, Gaylordsville; James Gardner Ryan, Newtown, both of Conn.; Reinhard Johannes Stengl, Stadtbergen, Germany

[73] Assignees: Siemens Aktiengesellschaft, Munich, Germany; International Business Machines Corporation, Armonk, N.Y.

[21] Appl. No.: 08/549,884

[22] Filed: Oct. 27, 1995

[51] Int. Cl.⁶ .................................................. H01L 21/4763
[52] U.S. Cl. ........................ 438/637; 438/639; 438/695
[58] Field of Search .................... 437/180, 52; 438/624, 438/634, 637, 392, 490, 491, 696, 943, 947, 437, 620, 688, 639, 695

[56] References Cited

U.S. PATENT DOCUMENTS

| | | | |
|---|---|---|---|
| 4,182,636 | 1/1980 | Dennard et al. | 148/187 |
| 4,409,722 | 10/1983 | Dockerty et al. | 29/571 |
| 5,112,763 | 5/1992 | Taylor et al. | 437/39 |
| 5,118,382 | 6/1992 | Cronin et al. | 156/643 |
| 5,118,634 | 6/1992 | Neudeck et al. | 438/620 |
| 5,157,000 | 10/1992 | Elkind et al. | 437/225 |
| 5,216,281 | 6/1993 | Butler | 257/750 |
| 5,217,919 | 6/1993 | Gaul et al. | 437/67 |
| 5,225,040 | 7/1993 | Rohner | 156/652 |
| 5,250,829 | 10/1993 | Bronner et al. | 257/301 |
| 5,286,344 | 2/1994 | Blalock et al. | 156/657 |
| 5,384,281 | 1/1995 | Kenney et al. | 437/189 |
| 5,420,057 | 5/1995 | Bennett et al. | 437/40 |
| 5,476,806 | 12/1995 | Roh et al. | 437/52 |
| 5,478,768 | 12/1995 | Iwasa | 437/52 |
| 5,583,368 | 12/1996 | Kenney | 257/621 |
| 5,605,862 | 2/1997 | Givens et al. | 437/180 |
| 5,651,857 | 7/1997 | Cronin et al. | 156/644.1 |
| 5,677,231 | 10/1997 | Maniar et al. | 438/437 |
| 5,792,703 | 8/1998 | Bronner et al. | 438/620 |

*Primary Examiner*—Charles Bowers
*Assistant Examiner*—Reneé R. Berry
*Attorney, Agent, or Firm*—Donald B. Paschburg

[57] ABSTRACT

A method of fabricating a self-aligned borderless contact in a semiconductor device. The semiconductor device includes a first conductor level, a patterned conductor level defining a pair of spaced apart conducting segments, and a dielectric insulating layer disposed between the first conductor level and the patterned conductor level, and over the pair of spaced apart conducting segments of the patterned conductor level. The method comprises the steps of etching a contact hole in a selected region of the dielectric insulating layer which lies above and is substantially aligned between the pair of the segments. The etching continues through the dielectric insulating layer so that a portion of the dielectric insulating layer remains between the contact hole and the first conductor level. A spacer is formed which lines the contact hole. The remaining portion of the insulating layer which extends between the contact hole and the first conductor level is then etched to extend the contact hole to the first conductor level. The spacer substantially prevents the erosion of the pair of spaced apart segments during the etching of the remaining portion of the insulating layer. The contact hole is then filled with a conductive material to form the self-aligned borderless contact. The borderless contact formed by the present method is electrically isolated from the pair of spaced apart conducting segments of the patterned conductor level by the dielectric insulating layer.

20 Claims, 4 Drawing Sheets

BORDERLESS CONTACT ETCH PROCESS WITH SIDEWALL SPACER AND SELECTIVE ISOTROPIC ETCH PROCESS

FIELD OF INVENTION

The present invention relates generally to controlled etching of narrow semiconductor features and more particularly, to a method of etching a contact hole for a self-aligned borderless contact.

BACKGROUND OF THE INVENTION

Advanced integrated circuits commonly employ microelectronic devices that are wired on different conductor levels. The conductor levels of these devices are electrically isolated from each other by thin dielectric insulating layers. Contact studs are employed to electrically couple selected conductor levels together. Generally, the contact studs pass through contact holes which extend through the thin dielectric insulating layers and/or other conductor levels. Such contact structures are fabricated by etching the contact holes into the insulating layers during circuit fabrication and then filling the contact holes with metallization prior to deposition and patterning of the next conductor level.

An example of such a contact structure is depicted in FIG. 1A. As can be seen, adjacent conductor levels 10 and 14 are electrically coupled to each other by a contact stud 16 which passes through a thin dielectric insulating layer 12. In this example, the contact stud is surrounded by the thin dielectric insulating layer and are often referred to in the art as a bordered contact.

Another type of contact structure is depicted in FIG. 1B, where a patterned conductor level 24 having spaced apart conducting segments 26 and 28, which for example may represent the gates of a transistor, are present between an upper conductor level 20 and a lower conductor level 34. The contact stud 36 in this example extends between the conducting segments 26 and 28 of the patterned conductor level 24. The contact stud 36, where it passes between the conducting segments 26 and 28, is electrically isolated from the patterned conductor level 24, by a thin dielectric insulating layer 30. Such a contact structure is often referred to in the art as a self-aligned borderless contact. Self-aligned borderless contacts provide a maximum contact area while minimizing the spacing required between the patterned conducting segments (gates) through which they pass. Thus, self-aligned borderless contacts increase the package densities of advanced integrated circuits. Accordingly, self-aligned borderless contacts are often used for submicron device fabrication.

Ideally, the self-aligned borderless contact shown in FIG. 1B, can be fabricated as follows. A first dielectric insulating layer 22 is deposited over the lower conductor level 20. The conductor level 24 is then deposited over the first dielectric insulating layer 22 and patterned to create the conducting segments 26 and 28. Next, the second dielectric insulating layer 30 is deposited over the conducting segments 26, 28 and then covered by depositing a third dielectric insulating layer 32. The third dielectric insulating layer 32 is subsequently planarized so that the upper conductor level can be deposited thereon in a later processing step. A self-aligning contact hole etching process is used to fabricate a contact hole in the third dielectric insulating layer 32 between the conducting segments 26 and 28. Such a process is accomplished by lithography and anisotropic etching techniques. The self-aligning etching process has to be selective to the first dielectric insulating layer 22 to protect the first conductor level 20 from uncontrolled etching or thinning and selective to the second dielectric insulating layer 30 to avoid a breaking through to the conducting segments 26 and 28. The final width of the contact hole in a self-aligning process is determined by the spacing between the conductor segments 26 and 28 in the patterned conductor level 24 shown in FIG. 1B. Next, an anisotropic etch is performed to extend the contact hole through the second dielectric insulating layer 30 and the contact stud 38 is formed by filling the contact hole with a conductor material.

There are, however, problems associated with the actual practice of the self-aligning contact hole etching process described above. In particular, during the etching of the contact hole, the corner of the conducting segments 26 and 28 are exposed to the etchant. This is due to the fact that the etching process actually generates a contact hole opening which is somewhat larger than the spacing between the conducting segments 26 and 28. This result occurs because the etch rate at a corner structure is much higher than the etch rate for a planar surface structure (up to 7 times higher), hence, the corners of the conducting segments can erode during the contact hole etch process. This remains the case even when materials with very high etch selectivity are employed, like polysilicon as an etch stop and/or BPSG as a dielectric.

For example, in the example shown in FIG. 1B, the selectivity of the anisotropic etching between third dielectric insulating layer 32 and the substantially thinner second dielectric insulating layer 30 is often not sufficient to provide a reliable etch stop at the second dielectric insulating layer 30. Typical thickness ratios between the third dielectric insulating layer 32 and the second dielectric insulating layer 30 are often greater than 10 to 1. Thus, in actual practice the prior art has attempted to solve the corner erosion problem, as shown in FIG. 1C, by providing an additional etch stop layer 38 between the third dielectric insulating layer 32 and the second dielectric insulating layer 30. As shown, the etch stop layer 38 is a doped polysilicon layer which is conductive. The polysilicon layer has a very high etching selectivity to the oxide of the third dielectric insulating layer 32. After the etching, the polysilicon layer 38 is oxidized and transformed into an insulating layer.

The solution described above still has its problems. In particular, when the polysilicon etch stop layer 38 is oxidized into the insulating layer, stresses are created which can cause device failures. Further, residuals of unoxidized polysilicon tend to remain after the oxidation process which causes shorts or high leakage in the second conductor level.

In response to the problems associated with the polysilicon etch stop layer, other prior art processes have been developed which employ aluminum oxide ($Al_2O_3$) instead of polysilicon to avoid the problems associated with oxidizing polysilicon. This is because $Al_2O_3$ is already an insulating layer and hence, no oxidation process is necessary. Substituting $Al_2O_3$ for polysilicon has one major disadvantage in that $Al_2O_3$ is difficult to etch.

Other prior art techniques have also been developed to prevent the gates from eroding during the etch process. One such process employs $Si_3N_4$ as an etch stop to take advantage of the selectivity between the $SiO_2$ and $Si_3N_4$. This process requires depositing a thick nitride cap and a nitride liner between the third dielectric insulating layer 32 and the second dielectric insulating layer 30. The etch process is carried out in a high density plasma reactor with decreased ion bombardment and reduced gas flow. During the process a polymer is generated on the sidewalls of the conducting segments to prevent chemical reaction.

Problems, however, are still associated with this technique. In particular, the selectivity to nitride at the corners is drastically reduced. Consequently, a novel etch tool is required to achieve the required selectivity. Polymer formation on the nitride is required for selectivity, but polymer can also form on the bottom of the hole and stop the etch.

Another process which has been proposed for preventing the gates from eroding during the contact hole etch process involves the fabrication of spacers in area of the contact holes. The spacer process involves a two step contact etch. The first etching step involves an anisotropic etch. Next, a polysilicon sidewall spacer is formed in the area of the contact hole which prevents the conducting segments from eroding during a second anisotropic etch which opens the contact holes.

A major problem with this technique is that the polysilicon spacers reduce the area of the contact holes which in turn, reduces the size of the contact studs.

It is, therefore, an object of the present invention to provide an improved self aligning contact hole etching method which substantially prevents the erosion of the conducting segments.

SUMMARY OF THE INVENTION

A method of fabricating an aperture in a semiconductor device. The semiconductor device includes a first conductor level, a patterned conductor level defining a pair of spaced apart segments, and a dielectric insulating layer disposed between the first conductor level and the patterned conductor level, and over the pair of spaced apart segments of the patterned conductor level. The method comprises the steps of etching an opening in a selected region of the dielectric insulating layer which lies above and is substantially aligned between the pair of the segments. The etching continues through the dielectric insulating layer so that a portion of the dielectric insulating layer remains between the opening and the first conductor level. A spacer is formed which lines the opening. The remaining portion of the insulating layer which extends between the opening and the first conductor level is etched to extend the opening to form the aperture.

The spacer substantially prevents the erosion of the pair of spaced apart segments during the etching of the remaining portion of the insulating layer.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

Although the method of the present invention can be used to control the etching of many different types of narrow semiconductor features, the method of the present invention is especially useful for etching contact holes between the gates of a transistor used in a DRAM cell. Accordingly the present invention will be described in conjunction with the fabrication of a self-aligned borderless contact for a bit line in a DRAM cell.

In a first embodiment of the self-aligning contact hole etch process of the present invention, a sidewall spacer and a highly selective isotropic etch process are used to fabricate a contact hole.

Figure 1A:
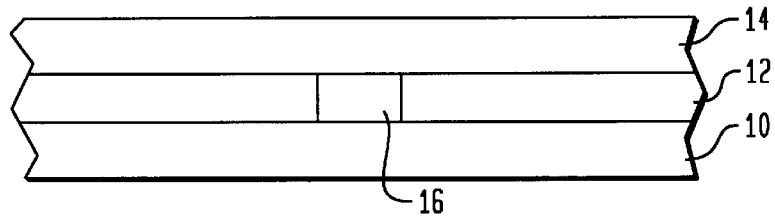
FIG. 1A depicts a cross-sectional side view through a typical semiconductor device having a prior art stud bordered contact structure.
Figure 1B:
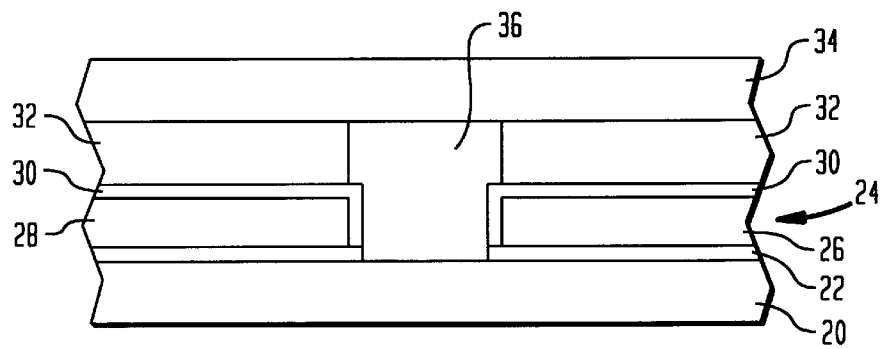
FIG. 1B depicts a cross-sectional side view through another typical semiconductor device having a self-aligned borderless contact structure formed according to a prior art method.
Figure 1C:
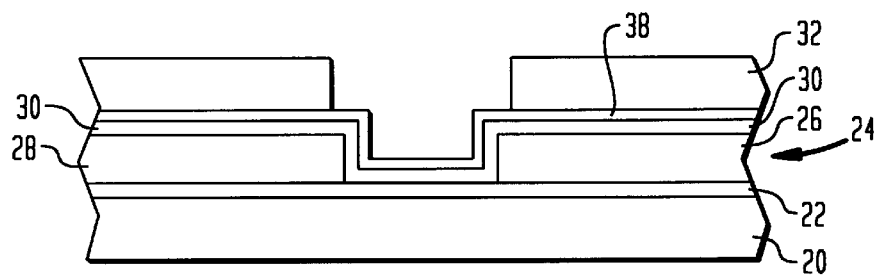
FIG. 1C depicts a cross-sectional side view through the semiconductor of FIG. 1B demonstrating a prior art technique for preventing gate erosion during the contact hole etch process.
Figure 2A:
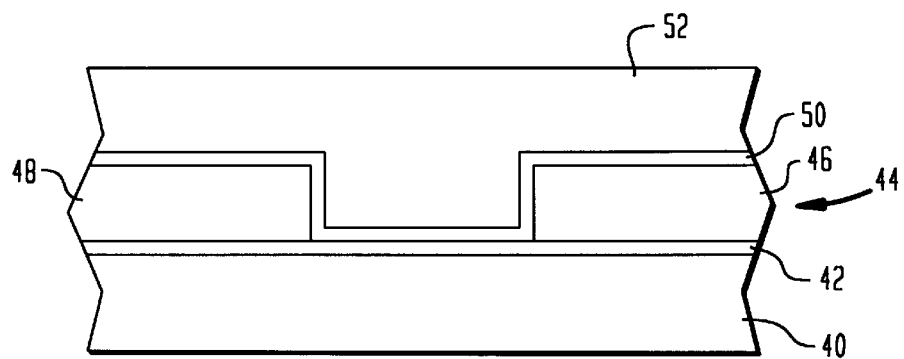
FIGS. 2A–2G depict cross-sectional side views through a typical semiconductor device showing the various processing steps of a first embodiment of the self aligning contact hole method of the present invention.

FIG. 2A depicts the device structure prior to the contact hole etch. As shown, a first dielectric insulating layer 42 of oxide such as silicon dioxide or silicon nitride, covers a lower conductor level 40 which can be a layer of single crystal or polycrystalline silicon. A patterned conductor level 44 of polysilicon or the like, covers the first dielectric insulating layer 42. The patterned conductor level 44 defines a pair of conducting segments 46 and 48 which form the gates of a transistor. A second dielectric insulating layer 50 of oxide of silicon dioxide or silicon nitride, covers the gates 46, 48 and the portion of the first dielectric insulating layer 42 which lies exposed between the gates 46 and 48. The second dielectric insulating layer 50 is covered by a third dielectric insulating layer 52 of oxide. The third dielectric insulating layer 52 preferably comprises a borophosphorous glass (BPSG) or tetra-ethoxysilane (TEOS).

Figure 2B:
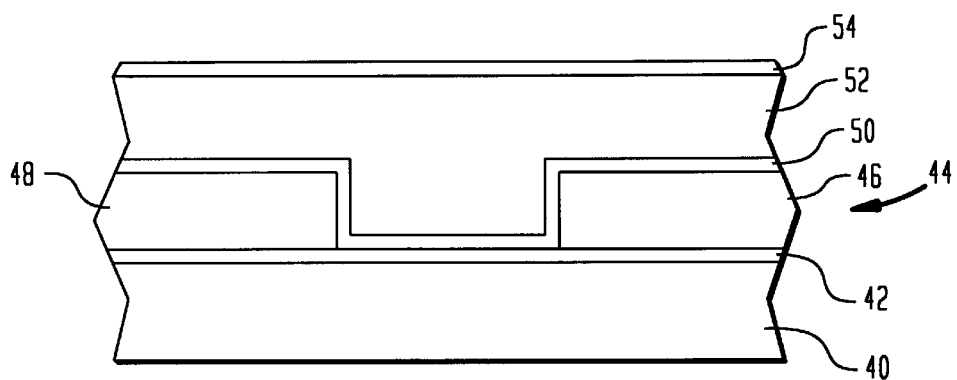

Referring now to FIG. 2B, an etch stop layer 54 is shown deposited over the third dielectric insulating layer 52. The etch stop layer 54 preferably comprises a polysilicon layer, a dielectric insulating layer such as nitride, or any other material which has a high selectivity to an oxide etch.

Figure 2C:
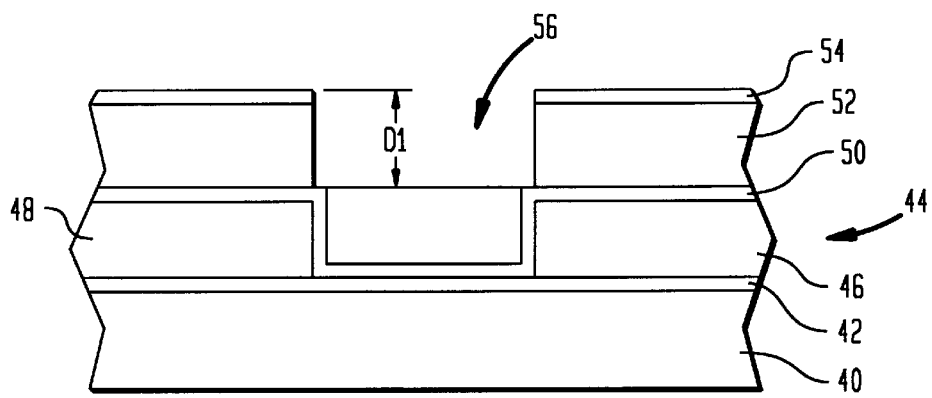

In FIG. 2C, a contact hole 56 has been partially fabricated by using conventional lithography and anisotropic dry etching techniques, in the etch stop layer 54 and the third dielectric insulating layer 52. The dry etching is timed only to extend to the depth shown as D1 in the third dielectric insulating layer 52. The depth D1 is chosen so that dry etching proceeds at least into the space between the gates while leaving a sufficient amount of the third dielectric insulating layer of oxide represented by depth D2, on top of the second dielectric insulating layer. The etch stop layer 54 in conjunction with the timing of dry etch operate to substantially prevent critical erosion the second dielectric insulating layer oxide located over the gates.

Figure 2D:
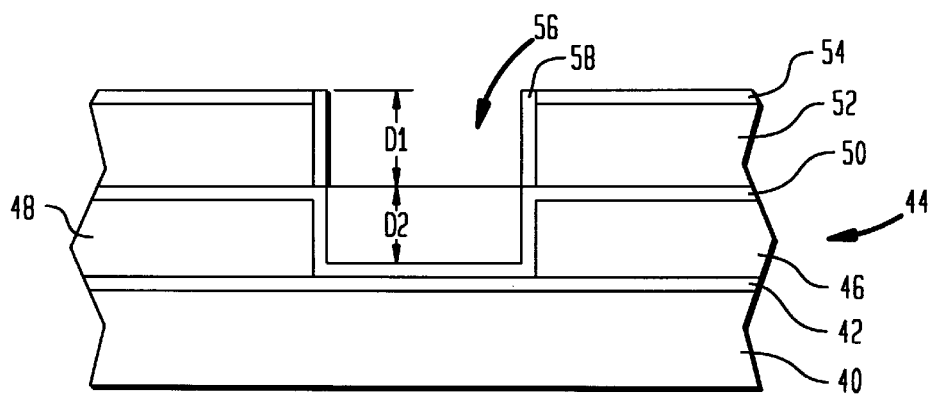
Figure 2E:
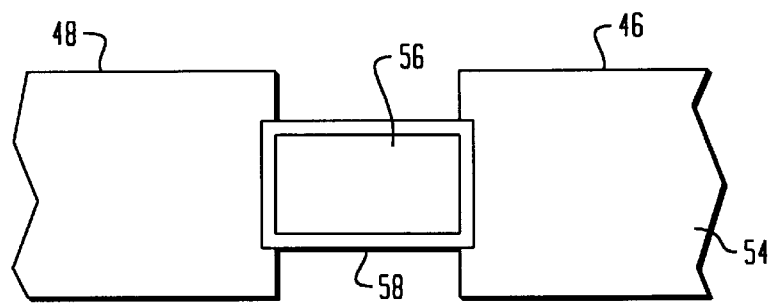

FIGS. 2D and 2E depict the fabrication of a sidewall spacer or liner 58 formed along the sidewalls of both the third dielectric insulating layer 52 and the etch stop layer 54. The spacer 58 is preferably fabricated from polysilicon, nitride or any other suitable conductive material using conventional deposition and dry anisotropic etching techniques. If the spacer 58 comprises nitride an additional advantage is realized. More specifically, the nitride spacer formed along the BPSG side walls of the contact hole 56 operates as a diffusion barrier for boron out diffusion into contact plug, if for example polysilicon is used as a contact fill.

Figure 2F:
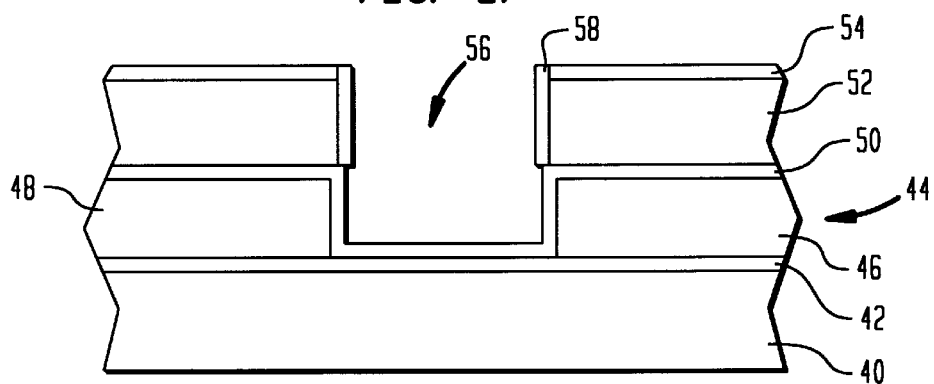

In any case, the portion of the third dielectric insulating layer oxide 52 remaining in the contact hole 56 which extends the depth D2 as shown FIG. 2D is subsequently removed using a conventional highly selective isotropic etching technique which is highly selective to composition of the second dielectric insulating layer 50. For example, in the case of a nitride dielectric insulating layer 50, a wet etch in buffered HF can be used which would have a selectivity to nitride of greater than 1000. It should be understood that the portion of the third dielectric insulating layer oxide 52 remaining in the contact hole can also be removed by other isotropic etching techniques such as CDE dry etching in a down stream plasma or by etching with HF vapor. The result of the isotropic etch is depicted in FIG. 2F which shows that the isotropic etch creates a lateral widening of the lower part of the contact hole 56 in the region of the contact hole 56 that is perpendicular to the gates 46 and 48. The lateral increase in the contact width will be comparable to the depth D2. Accordingly, for closely spaced contacts it may be necessary to increase the etch time for etching to the depth D1 so that the lateral etching which occurs during the removal of the third dielectric insulating oxide 52 at the depth D2 can be minimized.

The etch stop layer 54 disposed on the third dielectric insulating layer 52 is subsequently converted into an oxide using conventional oxidation techniques if the etch stop layer 54 comprises polysilicon. For this case, the converted etch stop layer 54 requires only a planar oxidation which is not critical to the device in terms of stress and residuals. Optionally, the etch stop layer 54 can be etched after filling the contact hole 56, using a selective wet (KOH) etch or a Fluorine based dry etch. Alternatively the etch stop layer can be removed using a downstream etch which is highly selective to SiN and $SiO_2$ or by CMP when the contact hole 56 is filled during the stud process. When the etch stop layer 54 comprises nitride no further oxidation or etch step is necessary. If, however, it becomes desirable to remove the etch stop layer 54 when it comprises nitride, a chlorine based down stream etch or by CMP during the stud process can be used to accomplish this.

Figure 2G:
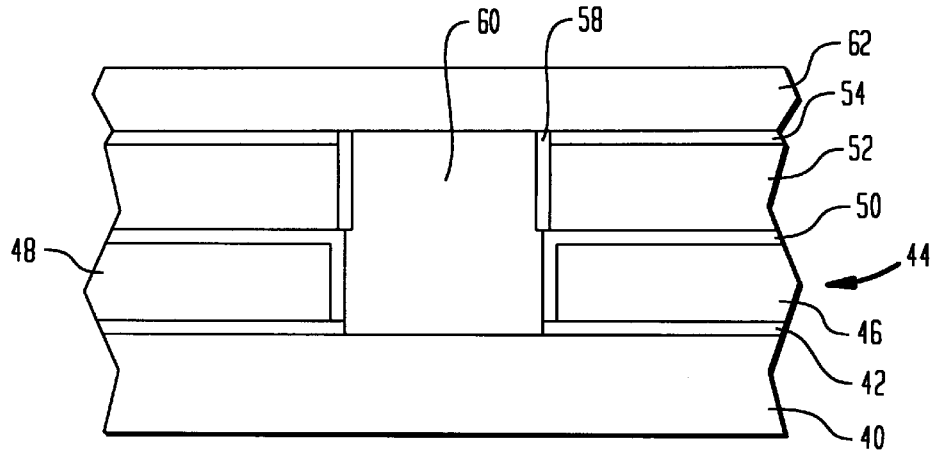

FIG. 2G depicts the final structure of a self-aligned borderless contact made in accordance with the method of the present invention. As can be seen the contact hole 56 has been extended to the lower conducting level 40 by removing the exposed planar portion of the second dielectric insulating layer 50 and the underlying portion of the first dielectric insulating layer 42 which both form the bottom of the contact hole 56 in FIG. 2F. This can be accomplished using any suitable dry etching technique. Further, the contact hole 56 has been filled with conducting polysilicon or a metal to complete the contact stud 60 which electrically couples an upper conductor level 62 to the lower conductor level 40.

In a second embodiment of the present invention, a sidewall spacer is used in conjunction with a combination of dry and wet etch to form a self-aligned borderless contact hole. Note that like reference numerals have been used to identify similar earlier described elements.

The method of the second embodiment of the present invention starts with the structure shown in FIG. 2A. An etch stop layer is then formed over the third dielectric insulating layer in the same manner as was described in the previous embodiment and a contact hole is partially fabricated using anisotropic dry etching techniques.

Figure 3A:
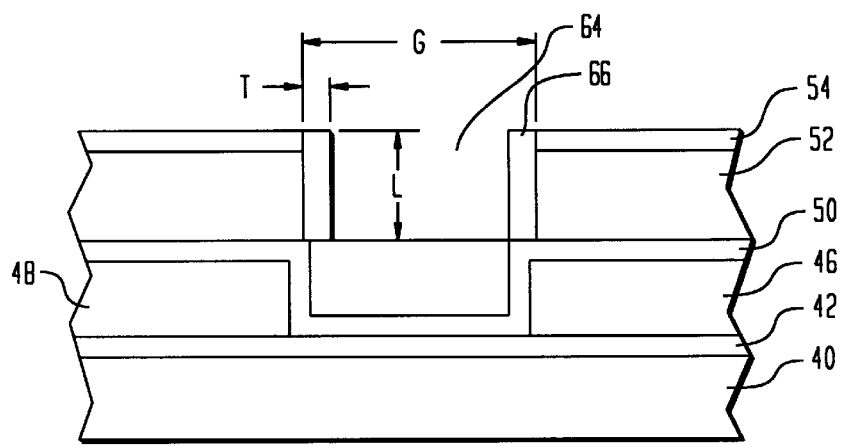
FIGS. 3A–3C depict cross-sectional side views through a typical semiconductor device showing the various processing steps of a second embodiment of the self aligning contact hole method of the present invention.

Referring now to FIG. 3A, a sidewall spacer 66 preferably of polysilicon, has been formed along the sidewalls of the contact hole 64. The spacer 64 protects the gates 46 and 48 from being eroded when the contact hole is extended in later processing steps as will be explained. If the material for filling the contact hole 64 comprises polysilicon, the spacer 66 will not create any problems and can remain in the contact hole 64 after finishing the contact hole etch.

The thickness T of the spacer 66 according to the second embodiment of the present invention depends on the misaligning offset of the self-aligned contact hole 64 formed during the anisotropic etch. For example, if the length L of the contact hole 64 is approximately 300 nm and the gap G between the gates 46 and 48, without the spacer 66, is approximately 250 nm, then the thickness T of the spacer 66 will be approximately 25 nm+X nm, where X equals the amount of misaligning offset.

Figure 3B:
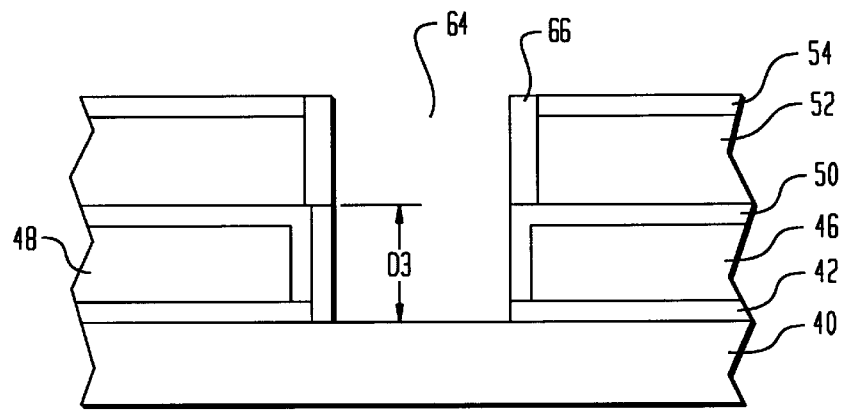

FIG. 3B, depicts the contact hole 64 after the third dielectric insulating layer oxide remaining in the contact hole 64 extending the depth D3 has been removed by a dry anisotropic oxide etch. The etch stops at the interface between the third and second insulating layers although the etch can also be timed to stop at the first conductive level as shown in FIG. 3B. In any case, the etch leaves a residual of the third dielectric insulating layer oxide 68 which will decrease the contact area. The residual of oxide is caused by the misaligning offset between the gates 46 and 48 and the contact hole 64. The spacer 66, however, protects the gates 46 and 48 even in worst case misaligning conditions.

Figure 3C:
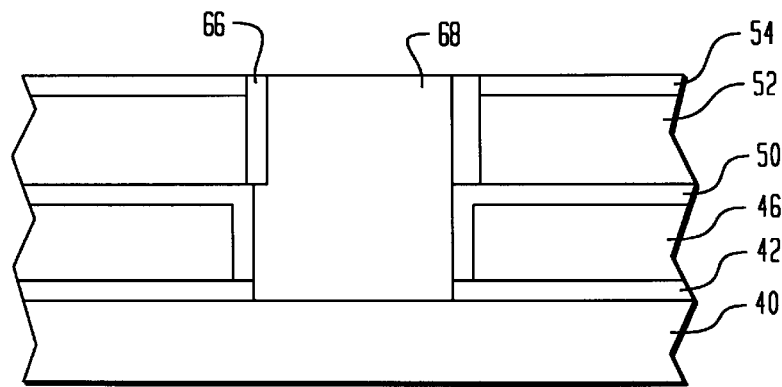

To increase the contact hole 64 size to the desired dimension, an isotropic oxide etch is performed. The etch is performed to a thickness of approximately 25 nm+X nm. Isotropic etching is accomplish using either a conventional wet or dry etch process. Regardless of the process, the etch time is adjusted to etch the thickness of X which is the amount of misalignment. FIG. 3C shows the resulting structure after isotropic etching and filling the contact hole 64 to produce a contact stud 68.

The second embodiment of the present invention has the advantage of decreasing the isotropic etching by a factor of D3/25 nm+X (<5). Thus, underetching in the directions that are perpendicular to the drawing plane, where there are no gate features, is reduced by that factor. The second embodiment of the present invention also maximizes the contact area which minimizes the contact resistance. Compared to the prior art poly etch stop process, no additional etch stop layer on top of the second dielectric insulating layer is necessary.

As should now be apparent, the present invention substantially overcomes many of the problems associated with prior art processes for fabricating self-aligned borderless contacts. In particular, the present invention substantially avoids gate erosion while the high selective isotropic etch maximizes the contact area. Further, the spacer used in the present invention does require removal after etching to the contact hole and can operate as a diffusion barrier or as a doping source.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A method of fabricating a self aligned borderless contact in a semiconductor device having a first conductor level, a patterned conductor level defining a pair of spaced apart conducting segments, a first dielectric insulating layer disposed between said first conductor level and said patterned conductor level, and a second dielectric insulating layer disposed over and between said pair of spaced apart conducting segments of said patterned conductor level, said first conductor level extending continuously between said spaced apart conducting segments, comprising the steps of:

etching a contact hole in a selected region of said second dielectric insulating layer which lies above and is substantially aligned between said pair of said conducting segments, wherein a portion of said second dielectric insulating layer remains between said contact hole and said first conductor level;

lining said contact hole with a spacer wherein the spacer contacts sidewalls of the contact hole and is disposed above said conducting segments;

etching said portion of said second insulating layer and a portion of said first dielectric insulating layer to extend said contact hole to said first conductor level, wherein said spacer substantially prevents the erosion of said pair of spaced apart conducting segments during said etching of said portion of said second insulating layer; and filling said contact hole with a conductive material to form a borderless contact in said semiconductor device, wherein said borderless contact is electrically isolated from said pair of spaced apart conducting segments of said patterned conductor level by said second dielectric insulating layer.

2. The method according to claim 1, further comprising the step of depositing a second conductor level over said borderless contact, wherein said borderless contact electrically couples said first conductor level to said second conductor level.

3. The method according to claim 1, wherein said step of etching said contact hole comprises dry etching.

4. The method according to claim 3, wherein said dry etching is anisotropic.

5. The method according to claim 1, wherein said step of lining said contact hole includes the steps of:

depositing a conductive material in said contact hole; and selectively etching said conductive material to form said spacer.

6. The method according to claim 1, wherein said step of etching said portion of said second dielectric insulating layer and said portion of said first dielectric insulating layer includes a selective isotropic etching.

7. The method according to claim 1, wherein said second dielectric insulating layer comprises two dielectric insulating layers, a first one of said two dielectric insulating layers being disposed over said pair of conducting segments of said patterned conductor level, and a second one of said two dielectric insulating layers being disposed over said first one of said two dielectric insulating layers.

8. The method according to claim 7, wherein said step of etching said contact hole is performed on said second one of said two dielectric insulating layers.

9. The method according to claim 8, wherein said step of etching said portion of said second dielectric insulating layer and said portion of said first dielectric insulating layer includes the step of isotropically etching said second one of said two dielectric insulating layers.

10. The method according to claim 9, wherein said step of etching said portion of said second dielectric insulating layer and said portion of said first dielectric insulating layer further includes the step of dry etching said first one of said two dielectric insulating layers and said first dielectric insulating layer to extend said contact hole to said first conductor level.

11. The method according to claim 7, further comprising the step of forming an etch stop layer over said second one of said two dielectric insulating layers prior to said step of etching said contact hole.

12. The method according to claim 1, further comprising the step of forming an etch stop layer over said second dielectric insulating layer prior to said step of etching said contact hole.

13. The method according to claim 1, wherein said step of etching said remaining portion of said second dielectric insulating layer leaves a residual portion of said dielectric insulating layer along a portion of said contact hole and further comprising the step of etching said residual portion of said second dielectric insulating layer prior to said step of filling said contact hole with a conductive material, in order to maximize the area of said contact.

14. A method of fabricating an aperture in a semiconductor device having a first conductor level, a patterned conductor level defining a pair of spaced apart conducting segments, a first dielectric insulating layer disposed between said first conductor level and said patterned conductor level, and a second dielectric insulating layer disposed over and between said pair of spaced apart conducting segments of said patterned conductor level, said first conductor level extending continuously between said spaced apart conducting segments, comprising the steps of:

etching an opening in a selected region of said second dielectric insulating layer which lies above and is substantially aligned between said pair of said conducting segments, wherein a portion of said second dielectric insulating layer remains between said opening and said first conductor level;

lining said opening with a spacer wherein the spacer contacts sidewalls of the opening and is disposed above said conducting segments;

etching said portion of said second insulating layer and a portion of said first dielectric insulating layer to extend said opening to said first conductor level to form an aperture, wherein said spacer substantially prevents the erosion of said pair of spaced apart conducting segments during said etching of said portion of said second insulating layer.

15. The method according to claim 14, wherein said step of etching said contact hole comprises dry etching.

16. The method according to claim 15, wherein said dry etching is anisotropic.

17. The method according to claim 14, wherein said step of etching said portion of said second dielectric insulating layer includes a selective isotropic etching.

18. The method according to claim 14, further comprising the step of forming an etch stop layer over said second dielectric insulating layer prior to said step of etching said opening.

19. The method according to claim 14, wherein said step of etching said portion of said second dielectric insulating layer leaves a residual portion of said second dielectric insulating layer along a lateral portion of said opening and further comprising the step of etching said residual portion of said second dielectric insulating layer in order to maximize the area of said aperture.

20. The method according to claim 14, wherein said second dielectric insulating layer comprises two dielectric insulating layers, a first one of said two dielectric insulating layers being disposed over said pair of conducting segments of said patterned conductor level, and a second one of said two dielectric insulating layers being disposed over said first one of said two dielectric insulating layers.

* * * * *